(12) United States Patent
Ding et al.

(10) Patent No.: US 10,652,823 B2
(45) Date of Patent: May 12, 2020

(54) WAKEUP RECEIVER

(71) Applicants: Panasonic Intellectual Property Management Co., Ltd., Osaka (JP); Stichting IMEC Nederland, Eindhoven (NL)

(72) Inventors: Ming Ding, Eindhoven (NL); Peng Zhang, Eindhoven (NL); Yan Zhang, Eindhoven (NL); Akio Hirata, Kyoto (JP); Akifumi Nagao, Kyoto (JP)

(73) Assignee: IMEC VZW, Leuven (BE)

( * ) Notice: Subject to any disclaimer, the term of this patent is extended or adjusted under 35 U.S.C. 154(b) by 71 days.

(21) Appl. No.: 15/993,205

(22) Filed: May 30, 2018

(65) Prior Publication Data

US 2018/0359706 A1 Dec. 13, 2018

Related U.S. Application Data

(60) Provisional application No. 62/516,511, filed on Jun. 7, 2017.

(51) Int. Cl.
*H04W 52/02* (2009.01)
*H04B 17/318* (2015.01)
*H03M 1/12* (2006.01)
*H04W 52/24* (2009.01)
*H03G 3/30* (2006.01)

(52) U.S. Cl.
CPC ..... *H04W 52/0229* (2013.01); *H03M 1/1205* (2013.01); *H04B 17/318* (2015.01); *H04W 52/0216* (2013.01); *H04W 52/0245* (2013.01); *H04W 52/245* (2013.01); *H03G 3/3052* (2013.01)

(58) Field of Classification Search
CPC . H03G 3/3052; H03M 1/1205; H04B 17/318; H04W 52/0229; H04W 52/0216; H04W 52/0245; H04W 52/245
See application file for complete search history.

(56) References Cited

U.S. PATENT DOCUMENTS

| 2013/0329621 A1* | 12/2013 | Kondo | H04W 52/0206 370/311 |
| 2018/0020405 A1* | 1/2018 | Huang | H04W 52/0229 |

* cited by examiner

*Primary Examiner* — Steven H Nguyen
(74) *Attorney, Agent, or Firm* — McDonnell Boehnen Hulbert & Berghoff LLP (57) ABSTRACT

Systems and methods providing a wakeup receiver for latency-critical applications are described herein. An example system includes a wakeup receiver communicatively coupled to a communication channel. The wakeup receiver is configured to monitor an input signal of the communication channel and down-convert the input signal to a DC signal. The system also includes an analog to digital converter (ADC) configured to digitize the DC signal and provide an ADC output. The system further includes a digital baseband (DBB) module configured to determine a received signal strength indication (RSSI) from the signal. The DBB is also configured to, for each packet, determine a respective packet length and compare the RSSI and respective packet length with a two-dimensional template. The DBB is additionally configured to, based on the comparison, determine an interrupt condition and, based on determining the interrupt condition, generate a wakeup signal.

22 Claims, 9 Drawing Sheets

|  | A | B | C | This work |
|---|---|---|---|---|
| Technology (nm) | 90 | 180 | 65 | 90 |
| Supply (V) | 1 | 1 | 1 | 2 |
| Frequency (MHz) | 915 | 402 | 400~2400 | 2400~2550 |
| Total Power (μW) | 120-RX/900-TX | 490-RX/400-TX* | 0.58-RX | 390-RX |
| Rx power (μW) | 120** | 490 | 0.1/0.24 | 164 |
| Sensitivity (dBm) | -83# | -68.6 | -39/-58# | -58 |
| Signal Modulation | OOK | FSK | Constant-Envelope | Constant-Envelope |
| Integrate PMU+DBB | No | No | Yes | Yes |
| Compliant to standard | No | - | Yes | Yes |
| Can measure RSSI | No | - | No | Yes |
| Wakeup latency | - | - | ~1s | ~100us |

*strongly dependent on LO frequency.   ** excl. clock generation power
rely on digital processing gain to further improve sensitivity

Figure 9

WAKEUP RECEIVER

CROSS-REFERENCE TO RELATED APPLICATIONS

The present application is a non-provisional patent application claiming priority to U.S. Provisional Patent Application No. 62/516,511, filed Jun. 7, 2017, the contents of which are hereby incorporated by reference.

FIELD OF THE DISCLOSURE

The present disclosure relates to a system and method for a fully-integrated energy-detection wakeup receiver.

BACKGROUND

Wireless sensor nodes (WSNs) in Internet of Things (IoT) applications require radio to be both low-power and small-area, in order to extend the battery life time and reduce the hardware cost. Meanwhile, in some IoT applications, the slave nodes require swift response upon receiving the signals from the master node. Therefore latency is critical, meaning that the receivers of the remote sensors have to be always on or frequently on in order to meet the latency requirement.

Monitoring channels continuously by a main radio can be quite power hungry for the system, with regard to the small battery capacity for these applications. Wakeup receiver (WuRx) based approaches are widely adopted to solve such issues.

WuRx is monitoring the channel continuously instead of the main radio, and therefore has to be low-power. To minimize the power consumption of WuRx, complex modulations (e.g., frequency-shift keying (FSK), phase-shift keying (PSK)) are often avoided due to necessity of a Local Oscillator (LO) generation, which either is power-hungry or needs calibration. Instead, simple On-off keying (OOK) modulation is typically adopted for the proprietary WuRx, enabling the deployment of a low-power energy-detection based receiver architecture. However, OOK modulation cannot be provided by most of the standard compliant radios. In addition, all of the aforementioned approaches require a customized wakeup transmitter, increasing system overhead. On the other hand, constant envelope based modulation schemes, such as Gaussian frequency-shift keying (GFSK) and Half-Sine offset quadrature phase-shift keying (HS-OQPSK), are adopted by Bluetooth low energy (BLE) and IEEE802.15.4 standards, which sheds light on a new wakeup radio design approach.

Some conventional systems include a WuRx, which directly operates with BLE advertising packets, but such systems suffer from large latency (~seconds), which can be a problem for latency-critical applications.

SUMMARY

It is an object of the present disclosure to provide a fully-integrated wakeup receiver for latency-critical applications using a 2-dimensional wakeup pattern.

These and other objects of the present disclosure are set forth, at least in part, as defined in the independent claims. Aspects of additional or alternative embodiments are set out in the dependent claims.

According to a first aspect of the present disclosure, a system is disclosed. The system includes a wakeup receiver communicatively coupled to a communication channel. The wakeup receiver is configured to monitor an input signal of the communication channel. The input signal includes a plurality of packets. Each packet includes a respective packet length. The wakeup receiver is further configured to down-convert the input signal to a DC signal. The system also includes an analog to digital converter (ADC) configured to digitize the DC signal and provide an ADC output. The system further includes a digital baseband (DBB) module configured to apply an automatic gain control (AGC) loop to the ADC output to provide a gain-controlled signal. The DBB is also configured to determine a received signal strength indication (RSSI) based on the gain-controlled signal. The DBB is additionally configured to, for each packet, determine the respective packet length and compare the RSSI and respective packet length with a two-dimensional template. The DBB is also configured to, based on the comparison, determine an interrupt condition and, based on determining the interrupt condition, generate a wakeup signal.

According to a second aspect of the present disclosure, a method is disclosed. The method includes monitoring, at a wakeup receiver an input signal of a communication channel. The input signal includes a plurality of packets, each packet including a respective packet length. The method includes down-converting the input signal to a DC signal and digitizing the DC signal with an analog to digital converter (ADC) to provide an ADC output. The method also includes applying, with a digital baseband (DBB) module, an automatic gain control (AGC) loop to the ADC output to provide a gain-controlled signal. The method also includes determining a received signal strength indication (RSSI) based on the gain-controlled signal and, for each packet, determining the respective packet length. The method additionally includes comparing the RSSI and respective packet length with a two-dimensional template. The method yet further includes, based on the comparison, determining an interrupt condition, and, based on determining the interrupt condition, generating a wakeup signal.

According to a fourth aspect of the present disclosure, a digital baseband (DBB) module is disclosed. The DBB module includes an automatic gain control (AGC) loop. The DBB module is configured to apply the AGC loop to an output of an analog to digital converter (ADC) to provide a gain-controlled signal. The DBB is also configured to determine a received signal strength indication (RSSI) based on the gain-controlled signal. The DBB is additionally configured to, for each packet, determine the respective packet length and compare the RSSI and respective packet length with a two-dimensional template. The DBB is also configured to, based on the comparison, determine an interrupt condition and, based on determining the interrupt condition, generate a wakeup signal. In this way, only one packet from the main radio is needed to generate a wakeup signal.

According to a fourth aspect of the present disclosure, a method is disclosed. The method includes applying, with a digital baseband (DBB) module, an automatic gain control (AGC) loop to an output of an analog to digital converter (ADC) to provide a gain-controlled signal. The method also includes determining a received signal strength indication (RSSI) based on the gain-controlled signal and, for each packet, determining the respective packet length. The method additionally includes comparing the RSSI and respective packet length with a two-dimensional template. The method yet further includes, based on the comparison, determining an interrupt condition, and, based on determining the interrupt condition, generating a wakeup signal.

BRIEF DESCRIPTION OF THE FIGURES

The above, as well as additional, features will be better understood through the following illustrative and non-limiting detailed description of example embodiments, with reference to the appended drawings.

All the figures are schematic, not necessarily to scale, and may show parts that elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

A fully-integrated energy-detection WuRx with a 2-dimensional wakeup pattern is described herein, enabling demodulation of wakeup information from a standard compliant constant-envelope packet, according to example embodiments. Some embodiments may generate a wakeup interrupt signal by using only one packet, which is desirable for latency-critical IoT applications.

In example embodiments, the WuRx can be paired with an existing standard-compliant main radio transmitter, e.g., BLE. A BLE system adopts GFSK modulation, and supports two data rate modes, 1 Mbps and 2 Mbps. In other example embodiments, the WuRx can be paired with any system that uses a constant envelope input signal. In an example embodiment, there are 40 channels located at the unlicensed 2.4 GHz frequency bands, among which there are three advertisement channels located at the low, middle and high bands. This can prevent the case that all the advertisement channels are polluted by other co-existing systems, e.g., WiFi. The wakeup signal is the same as that in the BLE communication, and is transmitted on the three advertisement channels.

A conventional energy-detection based WuRx may be utilized to detect a wakeup signal with the purpose to save power, however, such energy-based WuRx will not be able to demodulate the information in the GFSK modulated packet directly. Rather, further information, such as another dedicated transmitter for wakeup and the dedicated modulation scheme such as On-Off-Keying (OOK) to generate another signal for wakeup purpose may need to be employed to demodulate the information and thus to identify a certain node in the system.

Figure 1:
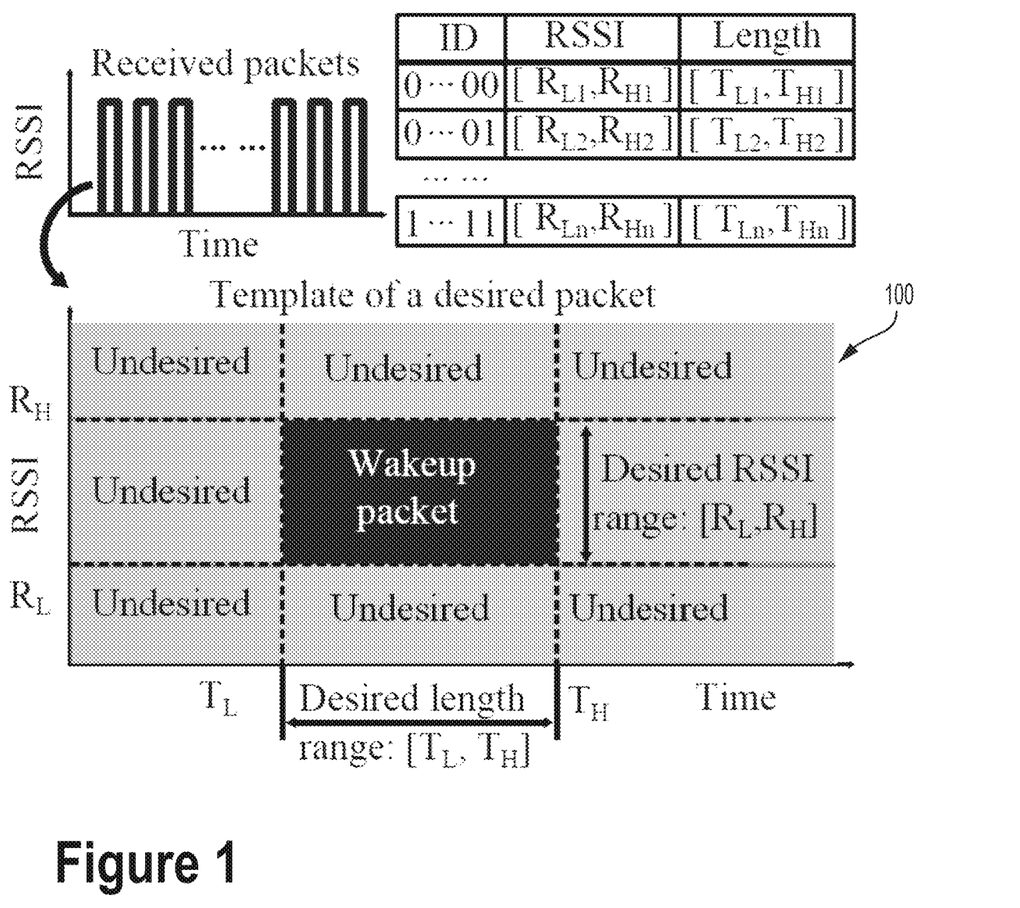
FIG. 1 is an illustration of a 2-dimensional wakeup pattern, according to an example embodiment.

In example embodiments, a 2-dimensional wakeup pattern is introduced, utilizing a received signal strength indication (RSSI) and a length of the received packet as a two-dimensional template 100 to identify a certain wakeup signal among all the signals in 2.4 GHz band, as illustrated and described in reference to in FIG. 1. The 2-dimensional wakeup pattern allows for a wakeup signal to be generated using only one packet. In example embodiments, the two-dimensional template 100 may be a two-dimensional lookup table with a first dimension corresponding to values within a pre-defined or desired RSSI range and a second dimension corresponding to values within a pre-defined or desired packet length range. Since a GFSK-based packet has constant envelope, an energy-detection based WuRx can measure these information accurately. For a WuRx node, if the measured RSSI and packet length of a detected signal are both within a pre-defined range, e.g., [$R_L$, $R_H$] and [$T_L$, $T_H$], a valid wakeup interrupt signal will be generated. Each node or group of nodes may have a specific RSSI and packet length. In an example embodiment, the pre-defined range of the RSSI [$R_L$, $R_H$] may be between about −30 dBm and about −60 dBm and the pre-defined range of the packet length [$T_L$, $T_H$] may be between about 130 µs and about 180 µs. Other ranges and thresholds are possible and contemplated. In addition, all those thresholds are programmable/adjustable, and a combination of both indicates a single node or a group of nodes as illustrated in FIG. 1. Thus, more than one node can be defined. In some scenarios, other radios (i.e., radios from different networks) could be sending packets with the same length and signal strength as the disclosed wake-up packet. Such interference will be recognized as wake-up packets. In certain applications, compared to misdetection, such false alarms are acceptable and can be handled at a higher protocol level.

Another challenge of this system is to accurately measure RSSI across a large dynamic range in an energy-detection base architecture. The energy-detection is equivalent to a square function, resulting in a quadratically increased envelope due to the non-linear operation. This doubles the required linear range for the analog baseband as well as the dynamic range of the ADC, increasing overhead in power and area for the analog circuits. Alternatively, a three-stage Automatic Gain Control (AGC) loop is introduced to relax the requirements for the analog circuit, meanwhile allowing an accurate measurement with an RF input strength ranging up to −30 dBm.

Figure 2:
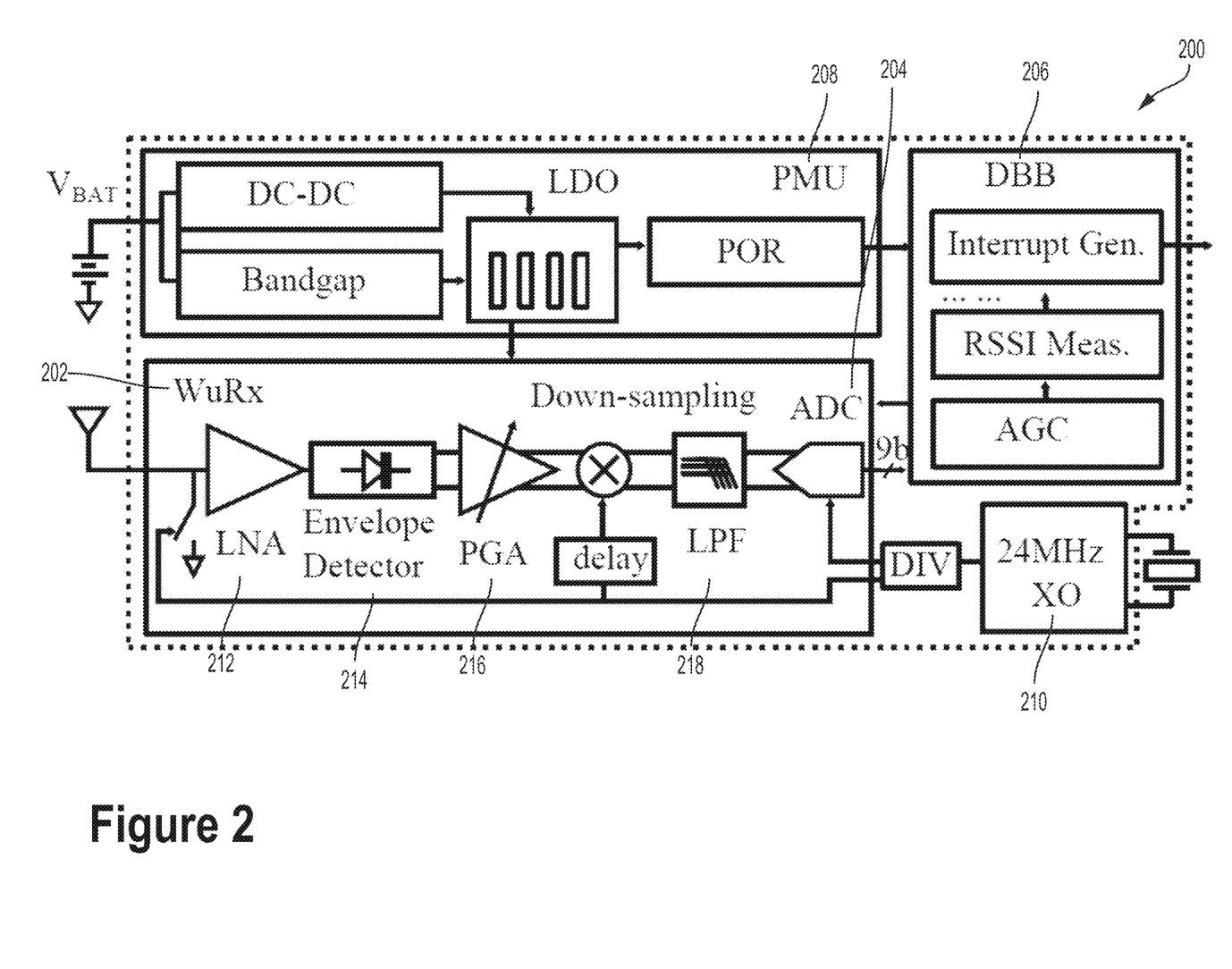
FIG. 2 is a block diagram of an implemented chip, according to an example embodiment.

FIG. 2 illustrates a block diagram of the implemented chip 200, which integrates a WuRx 202, a 9 bit ADC 204, a digital baseband (DBB) 206, a Power-Management-Unit (PMU) 208 and a crystal oscillator (XO) 210, according to an example embodiment. In an example embodiment, the WuRx 202 is always listening to the channel, down-converting the transmitted RF signal to a DC signal, which is digitized by the ADC 204. A digital processor further processes the ADC output, performs the AGC control to set the gain of the amplifying stages properly, measures both the time and the RSSI information of the detected packet, and correlates the measured information with the two-dimensional template as illustrated in FIG. 1. An interrupt signal will be generated if there is a match. In some embodiments, the whole chip may be supplied by a single battery voltage. When the chip is powered on, a Power-On-Reset (POR)

signal is generated, setting the operation conditions for the whole chip. Furthermore, in some examples, all the clocks used in this chip could be generated from a 24 MHz Pierce crystal oscillator.

The wakeup receiver 202 illustrated in FIG. 2 uses an energy-detection based structure for low-power and adapts a double-sampling scheme to suppress the DC offset and 1/f noise. In some embodiments, the wakeup receiver may include of a Low-Noise Amplifier (LNA) 212 with off-chip matching network, an Envelope Detector (ED) 214, two baseband amplifiers (programmable gain amplifier (PGA) 216 and low-pass filter (LPF) amplifier 218), as well as a clock control circuits for double-sampling operation. Moreover, in order to avoid saturation and measure RSSI accurately, the gain of the LNA 212, PGA 216, and LPF 218 is configured automatically by a 3-step AGC engine running in the background. This automatic configuration allows relaxation of the requirements for these analog components because the AGC control can compensate for minor component variability. Since the ED 214 dominates the noise of the receiver, most of the power is put in the LNA 212 to maximize its gain. The double-sampling scheme effectively reduces the DC offset and the 1/f flicker noise of the font-end. In addition, the remaining offset and noise is estimated in the DBB 206 to be further processed. A 9 bit successive approximation register (SAR) ADC operating at 200 kilo-samples per second (kSps), provides sufficient dynamic range while minimizing overhead in power and area, and allowing a ~2.5 µs accuracy in measuring the packet length. The PMU 208 may include a DC-DC converter, a bandgap voltage reference, a plurality of capacitorless low drop-out voltage regulators, a POR generation circuit, and at least one bias circuit. For example, the PMU 208 illustrated in FIG. 2 consists of a DC-DC converter, a bandgap voltage reference, 4 identical external capacitorless low-dropout (LDO) regulators, a POR generation circuit and biasing circuits for the entire chip.

Figure 3:
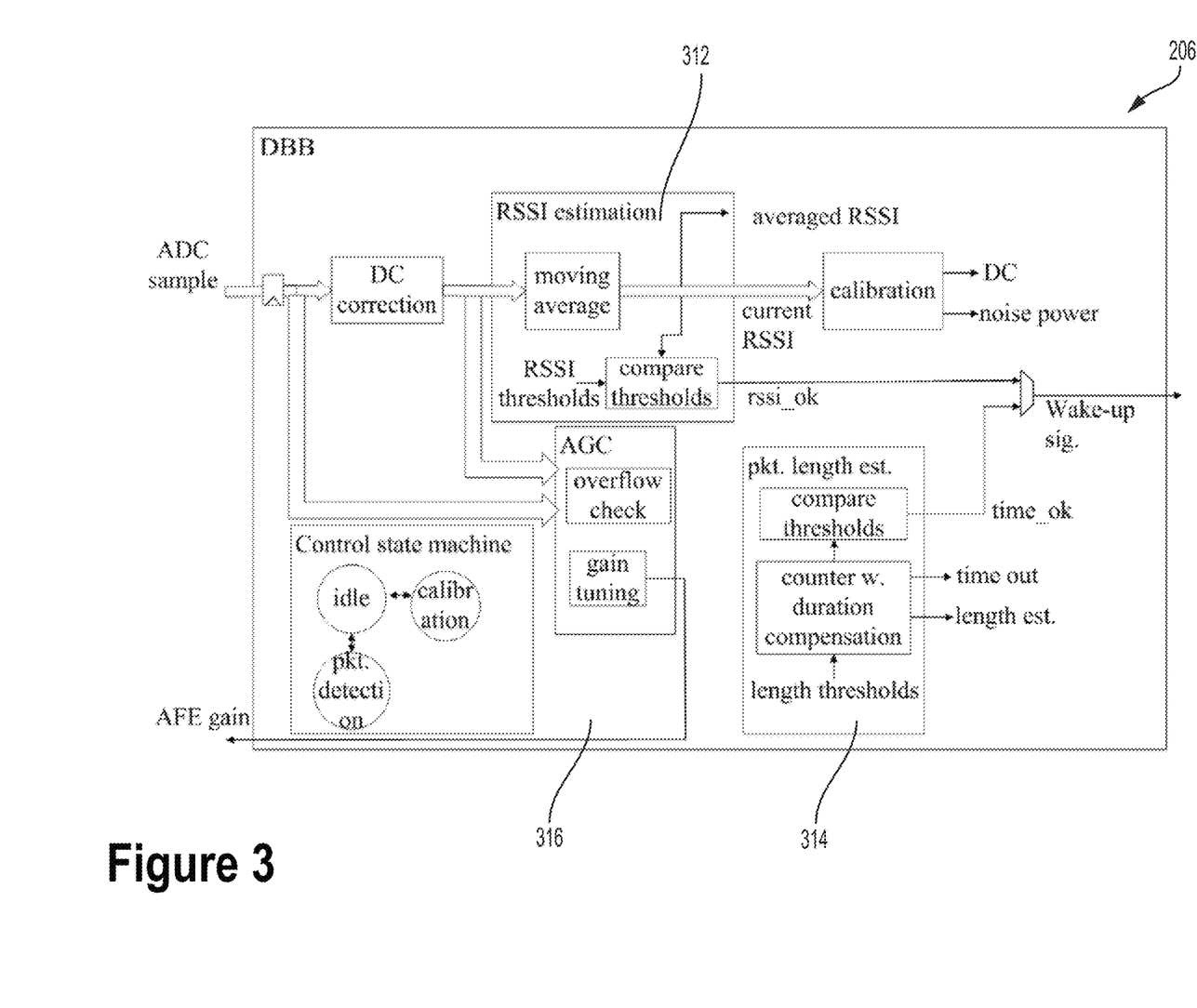
FIG. 3 is a block diagram of a digital baseband module, according to an example embodiment.

FIG. 3 illustrates an overview of DBB module 206, according to an example embodiment. The primary function of the developed DBB 206 is to perform wakeup detection by measuring the RSSI value (with an RSSI estimator 312) and length of a received packet (with a packet length estimator 314). As illustrated, in some embodiments, for obtaining the balance between estimation accuracy and low power design, a simple moving average could be applied as a filter to suppress the analog baseband noise mainly contributed by the ED 214. In addition, to cover the entire dynamic range, the 3-stage AGC 316 can be enabled in the beginning of a packet reception based on overflow testing of non-filtered ADC data to achieve a fast AFE gain tuning. The AGC is continuously monitoring the ADC output data. If overflow is detected, it will generate a certain digital control codes, which are the gain control bits for the analog blocks such as LNA, PGA, and LPF. By changing those gain control bits, the gain of the analog front-end will be changed. In one embodiment, it consists of 3 sets of gain settings in total.

Specifically, in some embodiments, the DBB may operate in either a calibration mode or a packet detection mode. The calibration mode may be used to estimate the DC offset in order to later be able to remove the DC offset during packet detection mode and thus correctly estimate the RSSI. For example, at power-up, a foreground calibration could be performed for the WuRx with a grounded LNA input, estimating the DC offsets and the noise $\sigma_n$ in the corresponding AGC mode. The calibration is performed based on the ADC output data. The DC offset can be calculated by averaging the ADC output data, and the noise $\sigma_n$ can be calculated by computing the standard deviation of the ADC output data.

After the foreground calibration process, the DBB could operate in the packet detection mode where the incoming ADC samples are first compensated using the DC offset provided from the calibration. In some embodiments, the DBB may continuously check the ADC output. Once the output reaches a threshold value or falls within a predetermined range, the DBB may start to measure the packet length by counting the number of the filtered samples (e.g., a duration counter). Hence, once the measured RSSI is below the RSSI low threshold, the duration counter stops. By correlating the measured packet length and RSSI value with the template as shown in FIG. 1, the DBB determines an interrupt condition and decides whether a wake-up signal can be triggered and goes back to the channel monitoring phase if needed. In an example embodiment, determining the interrupt condition includes determining that the RSSI is within a desired pre-defined RSSI range and that the respective packet length is within a desired pre-defined packet length range. In some embodiments, subsequent to determining the interrupt condition, the DBB may be further configured to change a value of the desired pre-defined RSSI range for a predetermined period of time. The value of the desired pre-defined RSSI range may be changed with an RSSI threshold signal, shown in FIG. 3. In an example embodiment, the pre-defined RSSI range could be adjusted or pre-programmed via software. Additionally or alternatively, the pre-defined RSSI range could be stored in on-chip memories prior to use.

On the other hand, misdetection and false alarms, which are undesired, can happen when the input signal approaches the sensitivity level. Some conventional systems rely on over-sampling to pursue additional gain to improve the performance, but at the cost of either higher power in DBB or huge latency (~s) in signal processing. Since both power and latency are important in this design, a dynamically-adjusted threshold is proposed for the RSSI threshold settings to minimize the probability of misdetection with a relatively low over-sampling ratio (4×).

Figure 4:
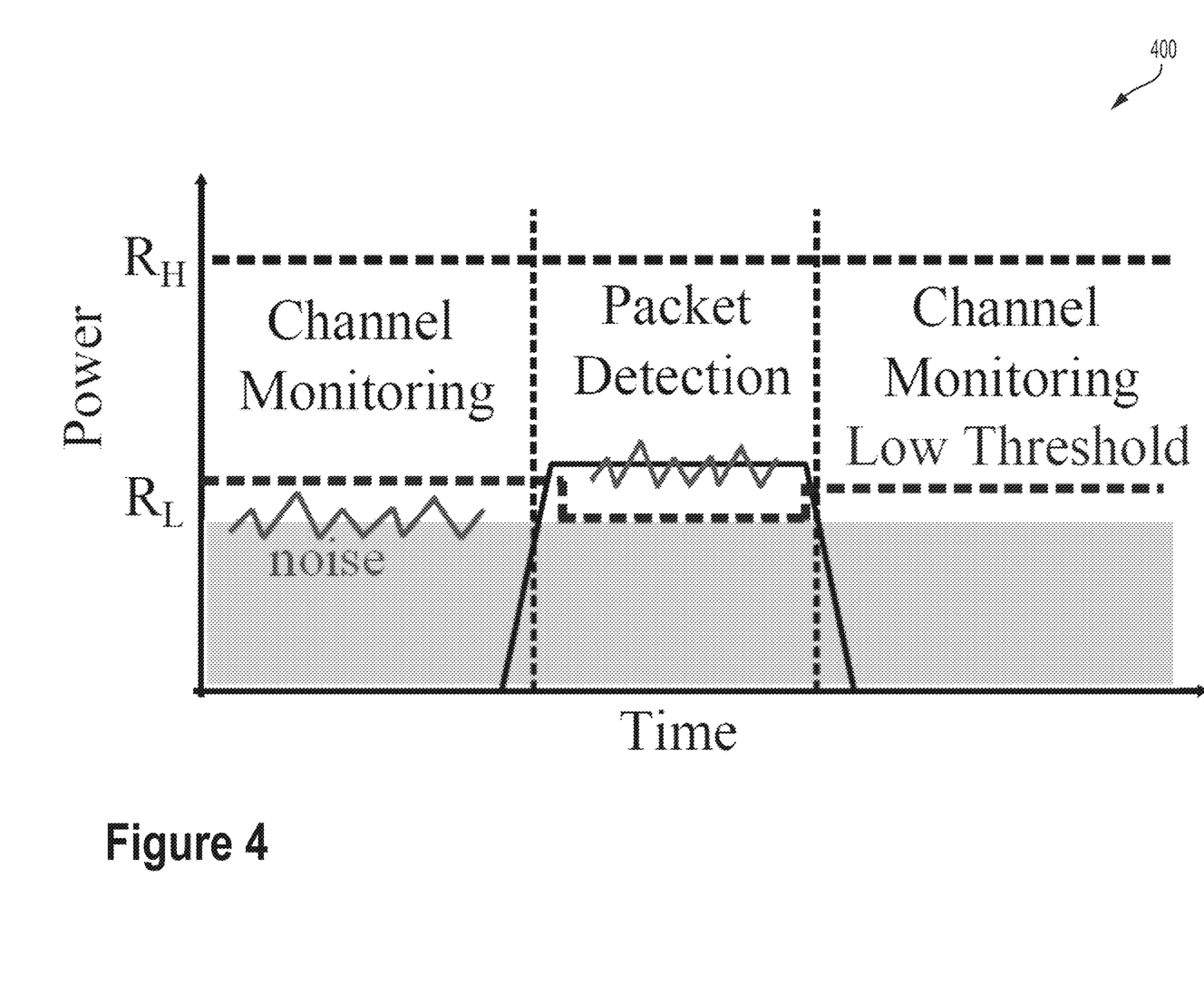
FIG. 4 illustrates a dynamically-adjusted threshold method, according to an example embodiment.

In some embodiments, when monitoring the channel, the RSSI low threshold is set to a minimum value to prevent the false triggering of the detection phase given by the thermal noise, as illustrated in FIG. 4. Similarly, once the DBB is in the packet detection phase, the RSSI low threshold can be lowered, preventing a false measurement termination due to the noise. Besides, to prevent short-time high-power interference from hampering the packet detection, the RSSI high threshold is ignored after the duration counter reaches a certain value which indicates a potential wake-up packet is being received.

Figure 5:
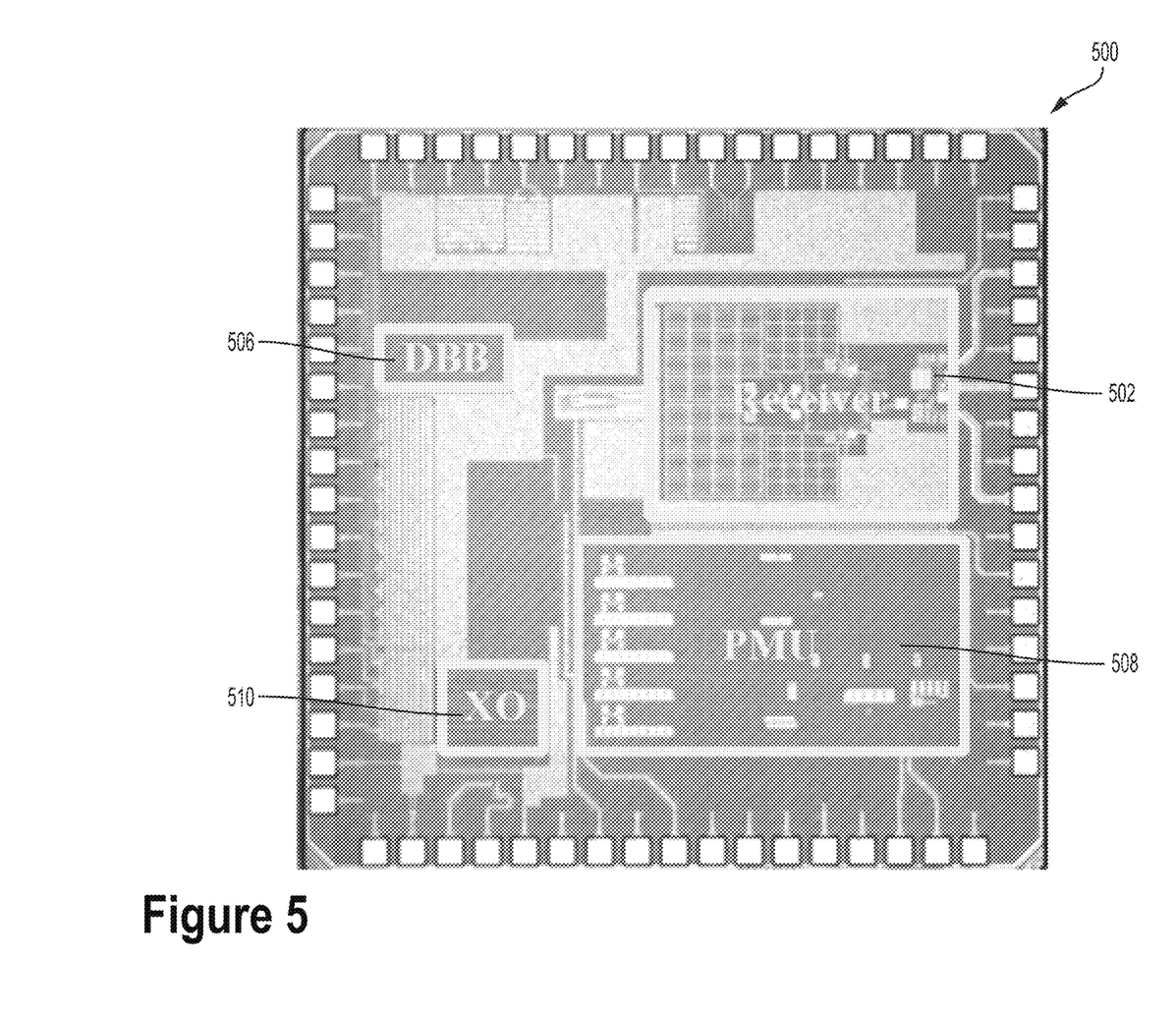
FIG. 5 is an image of a fabricated chip die, according to an example embodiment.

In example embodiments, each element of the system may be coupled to a common substrate. In some embodiments, the elements of the system are arranged on the common substrate having an area less than 1.3 mm². In an example embodiment, a prototype 500 was fabricated in 90 nm CMOS and the core area is 1.24 mm², as illustrated in FIG. 5. The whole chip consumes 195 µA at a 2.0V supply, resulting 390 µW total power consumption, 164 µW for the receiver (WuRx) 502, ADC and DBB 506, 96 µW for the crystal oscillator (XO) 510, and the rest is for the PMU 508. The functionality of the WuRx 502 is verified using customized BLE compliant packets at both 1 Mbps and 2 Mbps with a variable packet length ranging from 184 µs down to 72 µs. Hit rate is defined as the ratio between successfully detected packets and the total transmitted packets.

Figure 6:
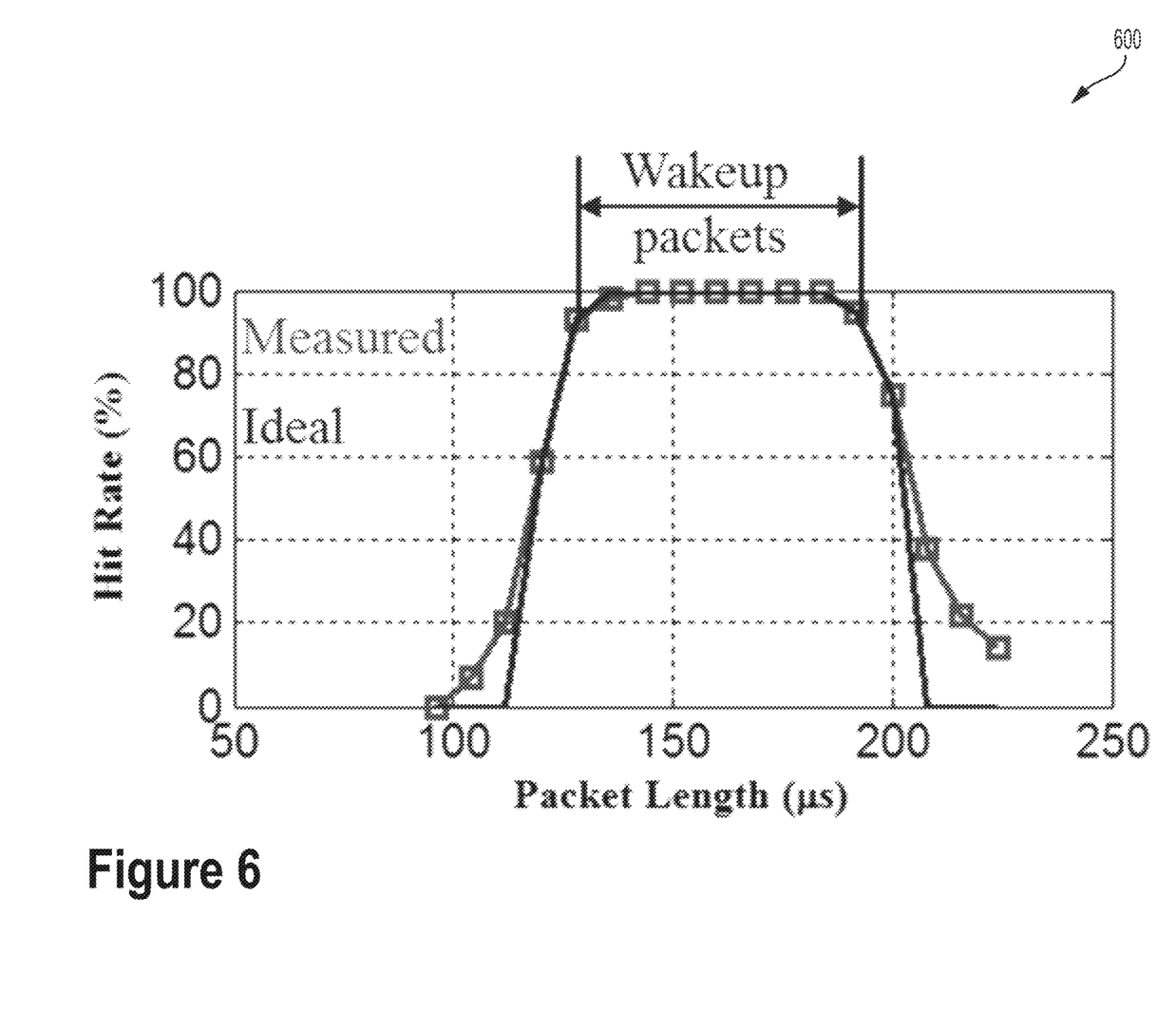
FIG. 6 illustrates a packet length measurement with a −58 dBm input, according to an example embodiment.

An example of the packet length (PL) measurement results 600 is shown in FIG. 6. With a −58 dBm signal at the input, the chip can successfully detect the packets that match with the template and reject the rest. In addition, the mean time without false triggering is higher than 600 s, which is sufficient for many standards for IoT applications (e.g., BLE). With the aforementioned false triggering rate, the hit rate of the system is measured.

Figure 7:
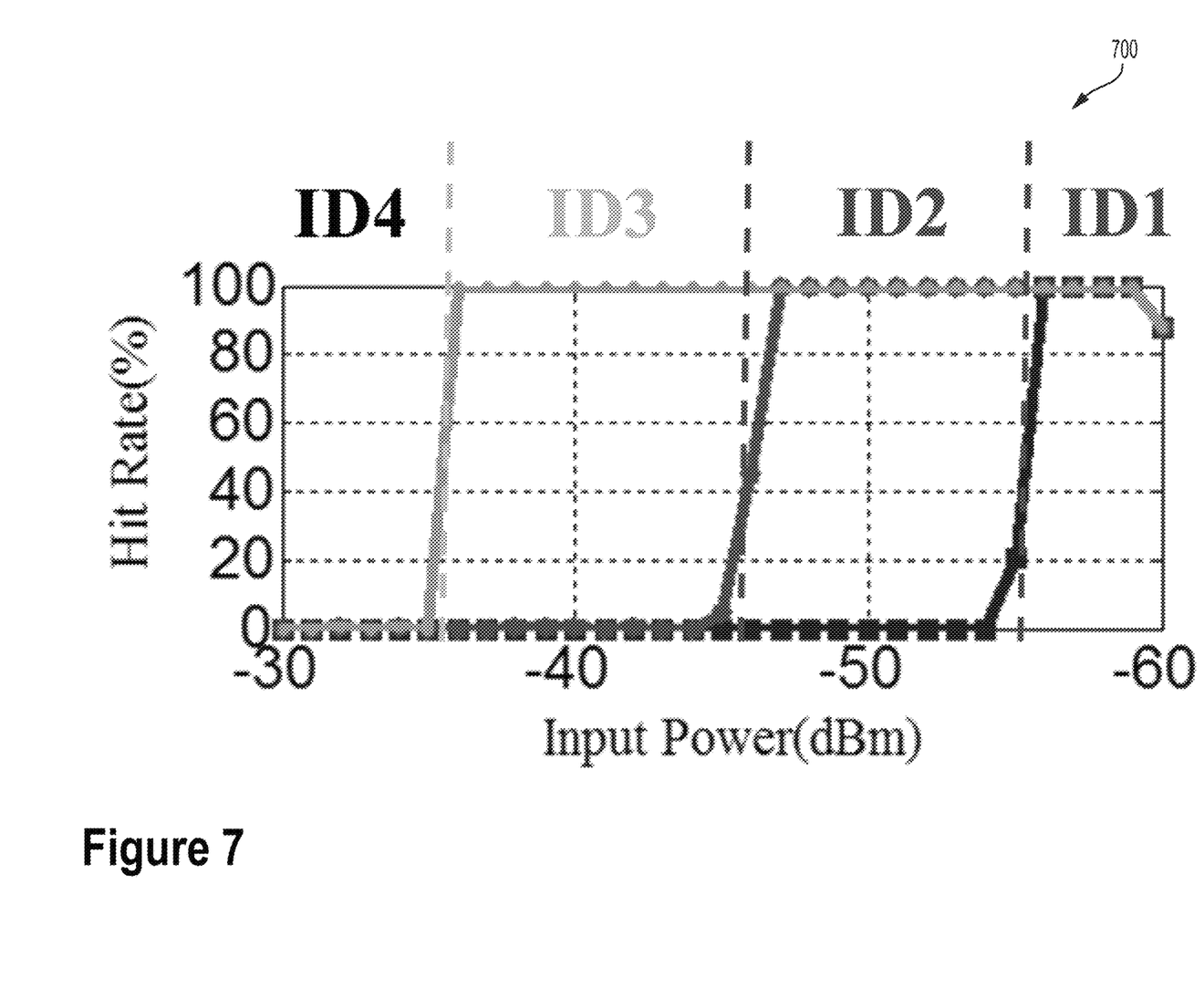
FIG. 7 illustrates a hit rate measurement at 1 Mbps, according to an example embodiment.
Figure 8:
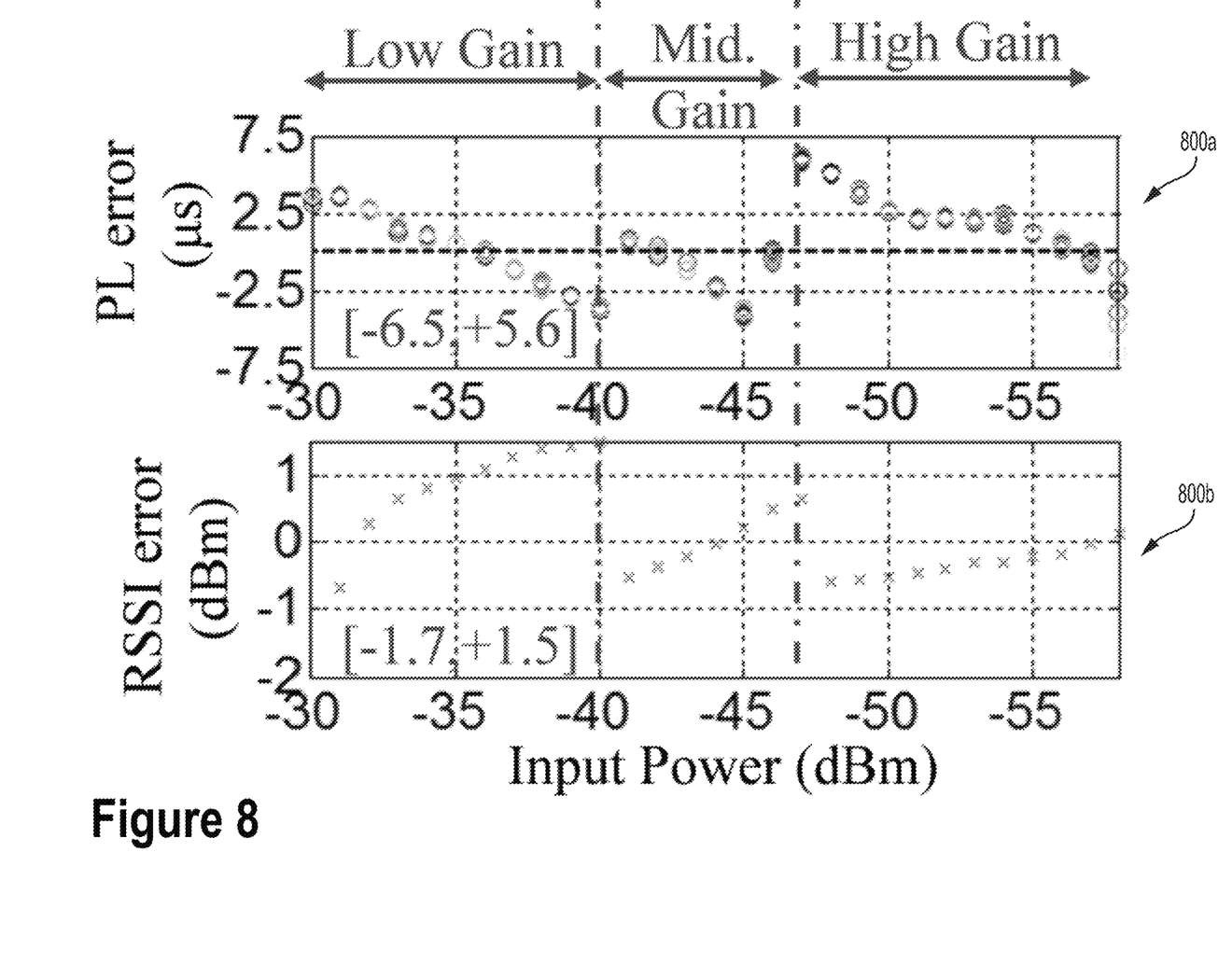
FIG. 8 illustrates measured packet length error and RSSI error, according to an example embodiment.

With a −58 dBm input, >99% hit rate (defines sensitivity) is achieved at 1 Mbps, which is robust for a short range application, as illustrated in a graph 700 in FIG. 7. In addition, with a programmable RSSI threshold, different nodes can be distinguished, as illustrated in the graph 700 in FIG. 7. With AGC enabled, the measured packet length error (mean value) is around ~6 μs and the RSSI error is around ±1.5 dBm at various packet length (136 μs~180 μs) and power (−30 dBm~−58 dBm), as illustrated in graphs 800*a* and 800*b* in FIG. 8, indicating the wakeup signal can be correctly detected.

Figure 9:
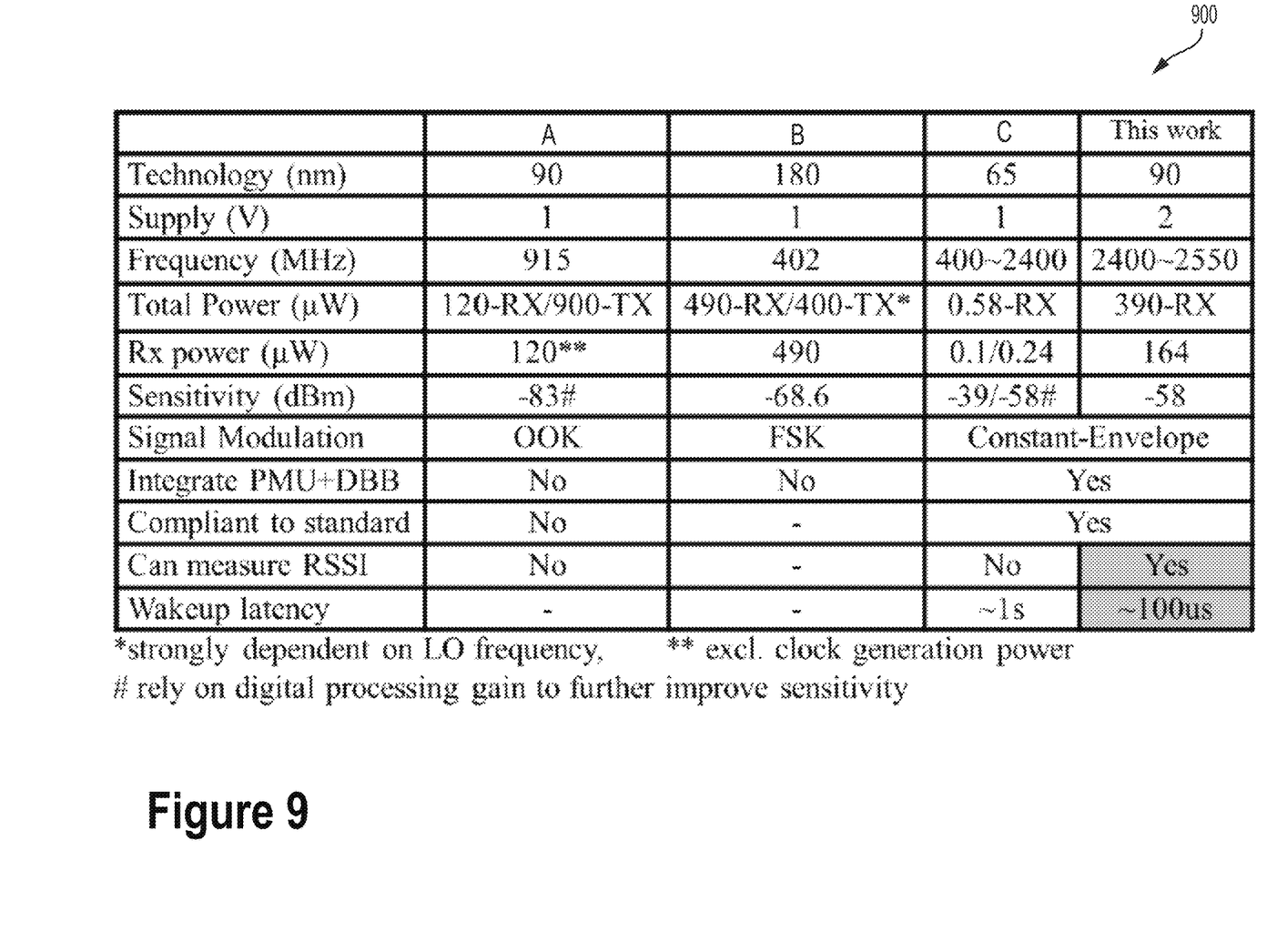
FIG. 9 illustrates a comparison table, according to an example embodiment.

FIG. 9 shows a comparison 900 of performance benchmarks, according to an example embodiment. In a conventional wakeup scheme as in A and B, besides the transmitter of the main radio, a dedicated transmitter is required to generate a specific signal such OOK signal for wakeup purpose. Therefore 2 transmitters in total are required. Compared to conventional systems A, the present disclosure reduces the total system overhead in power consumption and area by avoiding the wakeup transmitter. Some conventional systems such as C perform modulation on larger time scale, which allows a low-power receiver with intensive digital processing gain, but resulting in significant latency (~s). Compared to such systems, this work achieves 10000× lower latency, making it more suitable for the latency-critical IoT applications.

This work presented a 2.4 GHz fully-integrated wakeup receiver in 90 nm CMOS. Thanks to the proposed 2-dimensional wakeup pattern, the receiver can be paired to many popular IoT wireless standards with constant envelope modulations, while maintaining ~100 μs latency, which makes it very attractive for short-range latency-critical IoT applications.

The present disclosure has mainly been described with reference to a limited number of embodiments. However, as is readily appreciated by a person skilled in the art, other embodiments than the ones disclosed above are equally possible within the scope of the present disclosure, as defined by the appended claims.

For example, it should be realized that, in addition to at least one electrode without galvanic contact with the living being, a system may further comprise other sensors and/or electrodes, which may or may not be in galvanic contact with the living being, for acquiring further measurements which may be used in combination with the physiological measurements acquired by the at least one electrode without galvanic contact.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A system, comprising:
    a wakeup receiver communicatively coupled to a communication channel, wherein the wakeup receiver is configured to:
        monitor an input signal of the communication channel, wherein the input signal comprises a plurality of packets, each packet comprising a respective packet length; and
        down-convert the input signal to a DC signal;
    an analog to digital converter (ADC) configured to digitize the DC signal and provide an ADC output; and
    a digital baseband (DBB) module configured to:
        apply an automatic gain control (AGC) loop to the ADC output to provide a gain-controlled signal;
        determine a received signal strength indication (RSSI) based on the gain-controlled signal;
        for each packet, determine the respective packet length;
        compare the RSSI and respective packet length with a two-dimensional template;
        based on the comparison, determine an interrupt condition; and
        based on determining the interrupt condition, generate a wakeup signal.

2. The system of claim 1, wherein determining the interrupt condition comprises determining that 1) the RSSI is within a pre-defined RSSI range; and 2) the respective packet length is within a pre-defined packet length range.

3. The system of claim 2, wherein the two-dimensional template comprises a two-dimensional lookup table having a first dimension corresponding to values within the pre-defined RSSI range and a second dimension corresponding to values within the pre-defined packet length range.

4. The system of claim 2, wherein subsequent to determining the interrupt condition, the DBB is further configured to change a value of the pre-defined RSSI range for a predetermined period of time.

5. The system of claim 1, further comprising a power management unit (PMU), wherein the PMU is configured to:
    in response to the wakeup signal, generate a power-on-reset (POR) signal.

6. The system of claim 5, wherein the PMU comprises a DC-DC converter, a bandgap voltage reference, a plurality of capacitor-less low drop-out voltage regulators, a POR generation circuit, and at least one bias circuit.

7. The system of claim 1, wherein the wakeup receiver comprises a low-noise amplifier (LNA), an envelope detector (ED), a plurality of baseband amplifiers, and a plurality of clock control circuits.

8. The system of claim 1, further comprising a 24 MHz Pierce crystal oscillator.

9. The system of claim 1, wherein each element of the system is coupled to a common substrate.

10. The system of claim 9, wherein the elements of the system are arranged on the common substrate having an area less than 1.3 mm$^2$.

11. A method, comprising:
    monitoring, at a wakeup receiver an input signal of a communication channel, wherein the input signal comprises a plurality of packets, each packet comprising a respective packet length;
    down-converting the input signal to a DC signal;
    digitizing the DC signal with an analog to digital converter (ADC) to provide an ADC output;
    applying, with a digital baseband (DBB) module, an automatic gain control (AGC) loop to the ADC output to provide a gain-controlled signal;

determining a received signal strength indication (RSSI) based on the gain-controlled signal;

for each packet, determining the respective packet length;

comparing the RSSI and respective packet length with a two-dimensional template;

based on the comparison, determining an interrupt condition; and based on determining the interrupt condition, generating a wakeup signal.

12. The method of claim 11, wherein determining the interrupt condition comprises determining that 1) the RSSI is within a pre-defined RSSI range; and 2) the respective packet length is within a pre-defined packet length range.

13. The method of claim 12, wherein the two-dimensional template comprises a two-dimensional lookup table having a first dimension corresponding to values within the pre-defined RSSI range and a second dimension corresponding to values within the pre-defined packet length range.

14. The method of claim 12, further comprising, subsequent to determining the interrupt condition, changing a value of the pre-defined RSSI range for a predetermined period of time.

15. The method of claim 11, further comprising, with a power management unit (PMU), in response to the wakeup signal, generating a power-on-reset (POR) signal.

16. The method of claim 15, wherein the PMU comprises a DC-DC converter, a bandgap voltage reference, a plurality of capacitor-less low drop-out voltage regulators, a POR generation circuit, and at least one bias circuit.

17. The method of claim 11, wherein the wakeup receiver comprises a low-noise amplifier (LNA), an envelope detector (ED), a plurality of baseband amplifiers, and a plurality of clock control circuits.

18. The method of claim 11, wherein the wakeup receiver further comprise a 24 MHz Pierce crystal oscillator.

19. The method of claim 11, wherein the wakeup receiver and the DBB are coupled to a common substrate.

20. The method of claim 19, wherein the wakeup receiver and the DBB are arranged on the common substrate having an area less than 1.3 mm$^2$.

21. A digital baseband (DBB) module, comprising:

an automatic gain control (AGC) loop and a processor, wherein the processor of the DBB module is executable to:

apply the AGC loop to an output of an analog to digital converter (ADC) to provide a gain-controlled signal, determine a received signal strength indication (RSSI) based on the gain-controlled signal, for each of a plurality of packets, determine a respective packet length, compare the RSSI and the respective packet length with a two-dimensional template, based on the comparison, determine an interrupt condition, and based on determining the interrupt condition, generate a wakeup signal.

22. A method, comprising:

applying, with a digital baseband (DBB) module, an automatic gain control (AGC) loop to an output of an analog to digital converter (ADC) to provide a gain-controlled signal;

determining a received signal strength indication (RSSI) based on the gain-controlled signal;

for each of a plurality of packets, determining a respective packet length;

comparing the RSSI and the respective packet length with a two-dimensional template;

based on the comparison, determining an interrupt condition; and based on determining the interrupt condition, generating a wakeup signal.

\* \* \* \* \*